United States Patent [19]

Konrad

[11] Patent Number: 4,835,462

[45] Date of Patent: May 30, 1989

[54] MEANS FOR PROXIMAL END MEASUREMENT OF AC VOLTAGE ACROSS DISTAL END CABLE LOAD

[75] Inventor: William L. Konrad, East Lyme, Conn.

[73] Assignee: The United States of America as represented by the Secretary of the Navy, Washington, D.C.

[21] Appl. No.: 160,498

[22] Filed: Feb. 1, 1988

[51] Int. Cl.[4] ................ G01R 19/06; G01R 19/22
[52] U.S. Cl. ................... 324/119; 340/310 A; 379/24
[58] Field of Search ............... 324/522, 119, 120; 340/310 A; 379/26, 30, 24; 323/126

[56] References Cited

U.S. PATENT DOCUMENTS

| | | | |
|---|---|---|---|
| 2,829,343 | 4/1958 | Miller | 324/119 |
| 2,901,634 | 8/1959 | Lubin | 379/26 |
| 3,221,254 | 11/1965 | Ball et al. | 324/119 |
| 3,488,580 | 1/1970 | Anderson et al. | 379/26 |
| 3,571,530 | 3/1971 | Davies | 379/30 |
| 3,594,584 | 7/1971 | Woods | 340/310 A |
| 3,946,243 | 3/1976 | Anderson et al. | 340/310 A |
| 3,947,706 | 3/1976 | Holmes | 324/119 |
| 4,408,185 | 10/1983 | Rasmussen | 340/310 A |
| 4,754,472 | 6/1988 | King | 379/26 |

FOREIGN PATENT DOCUMENTS 2039402  8/1980  United Kingdom ........... 340/310 A

Primary Examiner—Reinhard J. Eisenzopf
Assistant Examiner—W. Burns
Attorney, Agent, or Firm—Michael J. McGowan; Arthur A. McGill; Prithvi C. Lall

[57] ABSTRACT

A voltage measuring device for accurately sensing the AC load voltage at the remote, distal end of a long, two-conductor cable, the measuring device comprising a parallel arrangement of an AC source and a DC voltmeter, located at the proximal, source end of the cable, and an AC load in parallel with a passive, DC producing module at the distal, load end of the cable, the passive module further comprising a passive, DC producing voltage divider, the output of which is proportional to the AC load voltage drop.

1 Claim, 1 Drawing Sheet

MEANS FOR PROXIMAL END MEASUREMENT OF AC VOLTAGE ACROSS DISTAL END CABLE LOAD

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION (1) Field of the Invention

The present invention relates to a voltage sensing device and more particularly to a means for accurately sensing the load-induced AC voltage drop across the remote, load end of a long two-conductor cable from the proximal end thereof.

(2) Description of the Prior Art

Often, long cables are required to feed electrical power to a remote load. The ensuing voltage drop across the load in these instances can be substantially different from the source voltage applied at the input end of the cable. This voltage difference is the result of IR drop in the cable due to cable resistance. In addition, where the cable length exceeds a small fraction of a wavelength at the applied frequency, such voltage difference is also contributed to by standing waves which occur when the load impedance and the characteristic cable impedance differ. There are many applications, however, where it is desirable to accurately know the voltage drop across a remote load but the load end of the cable is not readily accessible, such as when an underwater sound projector is the electrical load. In these cases in particular it is difficult to obtain an accurate measurement of the load voltage due to the IR drop not being precisely known or more importantly because standing waves are present and the cable and/or load impedance are not accurately known. In the latter case the load voltage may be equal to, greater than or less than the voltage applied at the cable input end.

SUMMARY OF THE INVENTION

Accordingly, it is a general purpose and object of the present invention to provide a means for remote measurement, from a cable proximal end, of actual load voltage at the distal end of a long cable without requiring use of additional conductors. It is a further object that such measurements be made despite the presence of standing waves in the cable. Another object is that such measurements not require that the load impedance be accurately known. Still another object is that such measurements be accurate despite variations in the applied frequency. A still further object is that a DC return voltage be passively generated at the load end of the cable, such voltage being directly proportional to the AC voltage drop across the load.

These objects are accomplished with the present invention by providing a voltage measuring device for accurately sensing the AC load voltage at the remote, distal end of a long, two-conductor cable, the measuring device comprising a parallel arrangement of an AC source and a DC voltmeter, located at the proximal, source end of the cable, and an AC load in parallel with a passive, DC producing module at the distal, load end of the cable, the passive module further comprising a passive, DC producing voltage divider circuit.

BRIEF DESCRIPTION OF THE DRAWINGS

A more complete understanding of the invention and many of the attendant advantages thereto will be readily appreciated as the same becomes better understood by reference to the following detailed description when considered in conjunction with the accompanying drawings, wherein.

DESCRIPTION OF THE PREFERRED EMBODIMENT

Figure 1:
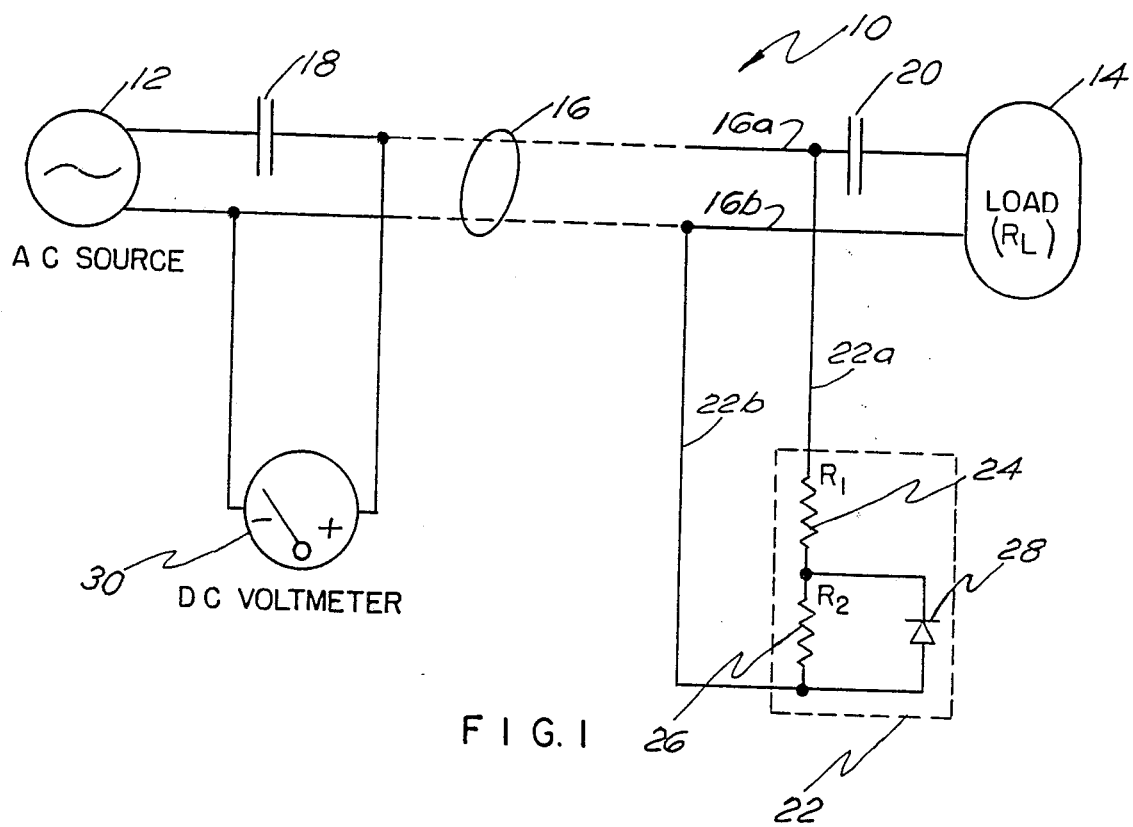
FIG. 1 shows a schematic diagram of a remote AC load voltage drop measuring device according to the present invention.

Referring now to FIG. 1 there is shown a system 10 for remote measuring of cable load end voltage drop according to the present invention. The alternating current (AC) voltage drop across the remote load end of the cable is sensed by converting a small portion of the load power into a direct current (DC) voltage, the magnitude of which is proportional to the AC load voltage. This proportional DC voltage is then transmitted back along the cable to the AC source end where the DC voltage magnitude is measured and the corresponding AC load voltage then is determined therefrom. Since the characteristic capacitance and inductance of the cable do not affect the proportional DC voltage, and also because a high resistance DC voltmeter is used for DC voltage measurements, the effect of cable voltage loss is negligible.

One embodiment of measurement system 10 is shown schematically in FIG. 1. An AC power source 12 supplies power to a load 14 having resistance $R_L$, load 14 being attached across the distal end of a long cable 16. Cable 16 further comprises two conductors, 16a and 16b which represent a high impedance due to their length. DC blocking capacitors 18 and 20 may be provided where source 12 or load 14 are known to conduct DC. When included, capacitors 18 and 20 act to prevent shorting of the DC signal generated by passive DC voltage producing circuit module 22. DC producing module 22 is located at the load 14 end of cable 16, and is electrically connected, by means of conductors 22a and 22b, to cable conductors 16a and 16b respectively thereby disposing module 22 across conductors 16a and 16b in parallel with load 14. DC producing module 22 further comprises series voltage divider resistors 24 and 26 having resistances $R_1$ and $R_2$ respectively, and a shunt diode 28. Module 22 reduces the AC voltage applied to diode 28 which is connected in parallel across resistor 26 and also minimizes loading on cable 16 due to relatively high total resistance. Diode 28 rectifies the AC volage across the parallel combination of load 14 and module 22 thereby producing a DC voltage component which is proportional to the AC voltage across load 14. This DC voltage is transmitted back along cable 16 to the AC source 12 end of cable 16 where it is displayed on high resistance DC voltmeter 30. It is noted that values $R_1$, and $R_L$ are selected such that $R_1 > > R_L$. It is also noted that $R_2$ is selected to be less than $R_1$ so as to permit use of lower voltage, commercially available diodes. The predetermined ratio of AC load voltage to the DC voltage generated by module 22 then allows the AC voltage to be accurately determined at the source end of cable 16. It is further noted that the AC voltage across load 14 in many cases varies with applied frequency when load 14 is of a reactive type. Standing waves may also be produced on the cable when the load is reactive or differs from the characteristic impedance of the cable. The proportional DC voltage generated by module 22, however, is independent of frequency and therefore the true load voltage drop is measurable at the source end of the cable regardless of the applied AC source frequency.

Figure 2:
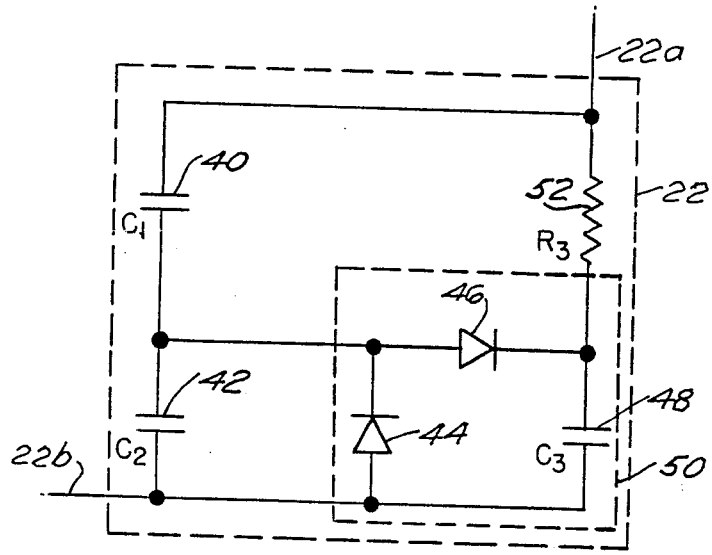
FIG. 2 shows an alternate embodiment of the DC voltage generating module of the device of FIG. 1.

FIG. 2 shows an alternative embodiment for DC producing module 22 of FIG. 1. This embodiment of module 22 also generates the desired DC voltage proportional to the AC load voltage drop. Here, series capacitors 40 and 42 form a voltage divider to reduce the cable voltage across diodes 44 and 46 which, in conjunction with capacitor 48, form a voltage doubling rectifier 50. Resistor 52, in series with rectifier 50, then feeds the proportional DC output of rectifier 50 back onto cable 16 for transmission to the source or proximal end thereof. Here, $C_1$ is selected to be less than $C_2$ to provide appropriate voltage levels for diodes 44 and 46. In addition, $C_1$ is selected such that its reactance is much less than the load impedance $R_L$ in order to minimize cable loading by module 22.

The chief advantage of the present invention is that it permits measurement of the AC voltage drop across a remote AC load from the easily accessible proximal end of a long two-conductor cable without need for additional conductors. This is particularly advantageous in the many cases where the load end of the cable is not readily accessible such as the case of an underwater acoustic projector serving as the load.

What has thus been described is a voltage measuring device for accurately sensing the AC load voltage at the remote, distal end of a long, two-conductor cable, the measuring device comprising a parallel arrangement of an AC source and a DC voltmeter, located at the proximal, source end of the cable, and an AC load in parallel with a passive, DC producing module at the distal, load end of the cable, the passive module further comprising a passive, DC producing voltage divider, the output of which is proportional to the AC load voltage drop.

Obviously many modifications and variations of the present invention may become apparent in light of the above teachings. For example: A wideband transformer may be used in lieu of voltage divider circuitry to reduce the AC cable voltage. Also, the values of the resistors or capacitors are varied to minimize the contribution of module 22 on the AC load voltage drop.

In light of the above, it is therefore understood that within the scope of the appended claims, the invention may be practiced otherwise than as specifically described.

What is claimed is:
1. An apparatus for remotely measuring voltage, comprising:
   AC power source means, for producing an AC electrical signal, said AC source means further comprising, an AC source and at least one blocking capacitor connected in series with said AC source, for preventing DC voltage produced by said DC generating means from short circuiting through said AC source;
   a long electrical cable, having a proximal end, a distal end and first and second leads, the proximal source end thereof being connected to said AC power source, for receiving said AC signal therefrom;
   electrical load means, electrically connected across said first and second leads of the distal, load end of said long cable, for receiving said AC signal from said long cable, said electrical load means further comprising at least one blocking capacitor for preventing DC voltage produced by said DC generating means from short circuiting through said load and an AC load connected in series with said blocking capacitor;
   DC signal generating means, electrically connected across said first and second leads of said cable at said load end, for receiving said AC voltage signal across said load and producing a corresponding DC return signal therefrom, said DC signal generating means further comprising, a first series capacitor, electrically connected at one end thereof to said first lead of said cable, a second series capacitor, electrically connected at one end thereof to said first capacitor, the other end being connected to said second lead of said cable thereby forming a capacitive voltage divider, voltage doubling rectifier means, connected across said capacitive voltage divider, for producing said proportional DC voltage, and a resistor, connected in series with said rectifier means for receiving said DC voltage produced by said rectifier means and producing said DC return signal therefrom; and
   a DC voltmeter, electrically connected across said first and second leads of said cable at said AC power source means end thereof, for measuring and indicating said DC return voltage from said load end.

* * * * *